(12) United States Patent
Sudo

(10) Patent No.: US 8,153,501 B2
(45) Date of Patent: Apr. 10, 2012

(54) MASKLESS SELECTIVE BORON-DOPED EPITAXIAL GROWTH

(75) Inventor: Gaku Sudo, Yokohama (JP)

(73) Assignee: Toshiba America Electronic Components, Inc., Irvine, CA (US)

( * ) Notice: Subject to any disclaimer, the term of this patent is extended or adjusted under 35 U.S.C. 154(b) by 72 days.

(21) Appl. No.: 12/397,279

(22) Filed: Mar. 3, 2009

(65) Prior Publication Data

US 2009/0224368 A1     Sep. 10, 2009

Related U.S. Application Data

(60) Provisional application No. 61/034,293, filed on Mar. 6, 2008.

(51) Int. Cl.
*H01L 21/76* (2006.01)

(52) U.S. Cl. .................. 438/424; 438/510; 438/697

(58) Field of Classification Search .................. 438/424, 438/510, 697
See application file for complete search history.

(56) References Cited

U.S. PATENT DOCUMENTS

| | | | |
|---|---|---|---|
| 7,075,160 B2 * | 7/2006 | Partridge et al. | 257/414 |
| 7,514,328 B2 * | 4/2009 | Rao | 438/285 |
| 2006/0084247 A1 * | 4/2006 | Liu | 438/510 |

OTHER PUBLICATIONS

T. Ghani, "A 90nm High Volume Manufacturing Logic Technology Featuring Novel 45nm GateLength Strained Silicon CMOS Transistors", Dec. 7, 2003.

* cited by examiner

*Primary Examiner* — Howard Weiss
*Assistant Examiner* — Steven Rao
(74) *Attorney, Agent, or Firm* — Banner & Witcoff, Ltd.

(57) ABSTRACT

A semiconductor device, comprising a silicon layer, an n-type field-effect transistor (NFET) disposed in and on a silicon layer, and a p-type field-effect transistor (PFET) disposed in and on the silicon layer, wherein the PFET includes a boron-doped silicon-germanium layer disposed on the silicon layer. Also, a method for manufacturing a semiconductor device, comprising forming a first conductive layer over a p-well of a silicon layer, forming a second conductive layer over an n-well of the silicon layer, implanting fluorine ions into both the p-well and the n-well, exposing both the p-well and the n-well to ammonium hydroxide and peroxide, and epitaxially growing a boron-doped silicon-germanium layer on the silicon layer.

16 Claims, 2 Drawing Sheets

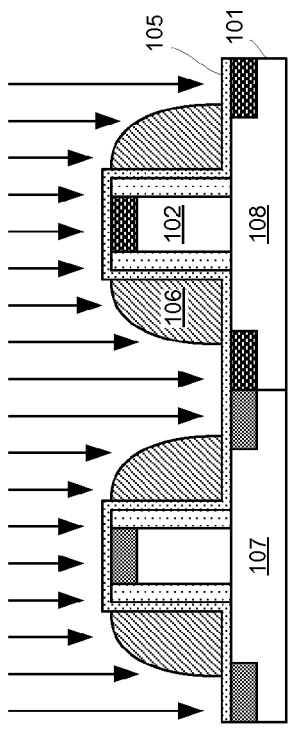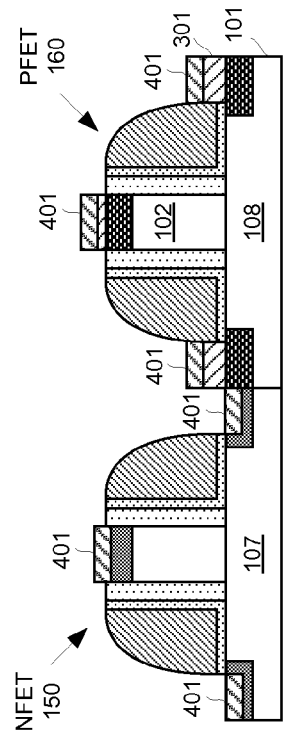
Fig. 2
Fig. 4
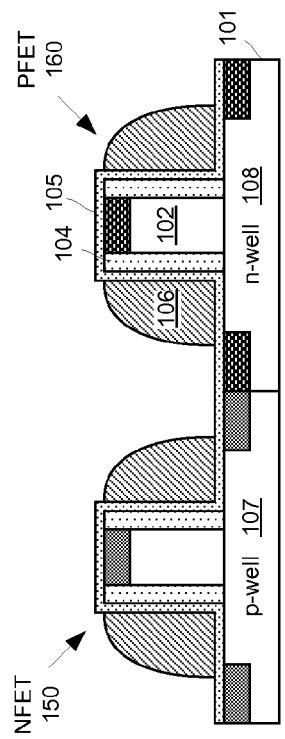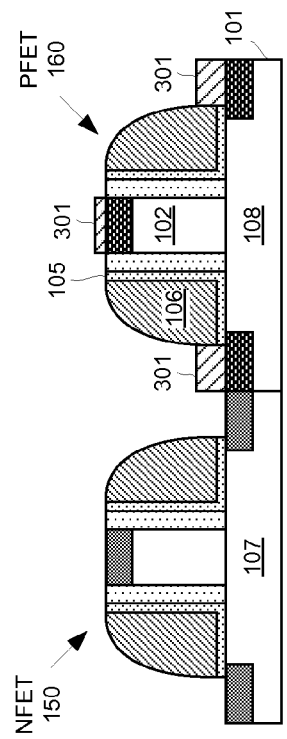
Fig. 1
Fig. 3

MASKLESS SELECTIVE BORON-DOPED EPITAXIAL GROWTH

CROSS-REFERENCE TO RELATED APPLICATIONS

The present application claims priority to U.S. Provisional Patent Application Ser. No. 61/034,293, filed Mar. 6, 2008, and hereby incorporated by reference herein as to its entirety.

BACKGROUND

The performance of a p-type field-effect transistor (PFET) in a semiconductor device depends on a variety of factors. One factor is the contact resistance between the silicide contacts and the source/drain regions of the underlying silicon layer. The lower the resistance, the higher the performance of the PFET. Likewise, the greater the resistance, the lower the performance of the PFET.

In conventional semiconductor devices, to reduce the contact resistance between the silicide contacts and the source/drain regions, a boron-doped silicon-germanium layer would be embedded in the silicon layer, and the silicide contacts would be disposed on the boron-doped silicon-germanium layer. The boron-doped silicon-germanium layer had to be formed prior to source/drain anneal. Because source/drain anneal causes boron ions to migrate away from the silicon-germanium and into the surrounding silicon, the silicon-germanium layer would be doped with an amount of extra boron ions calculated to result in the correct doping post-anneal.

Moreover, the embedded silicon-germanium layer generally prevents the use of a very thin substrate, such as a thin upper silicon layer that is part of a silicon-on-insulator (SOI) wafer.

SUMMARY

Illustrative aspects of the present disclosure are directed to reducing the resistance of the silicide contacts of a p-type field-effect transistor (PFET) in a semiconductor device. The resistance may be lowered, for instance, by increasing the boron dopant concentration of those regions of the silicon that interface with the silicide contacts. This may be achieved, for example, by forming a boron-doped epitaxial growth of silicon germanium on top of the silicon layer. The epitaxial growth may be performed before or after source/drain annealing.

Further illustrative aspects of the present disclosure are directed to forming such boron-doped silicon-germanium epitaxial growth without the need for a mask. In other words, the epitaxial growth may be self-aligning. Such self-alignment may be achieved by performing appropriate preparation steps that encourage boron-doped silicon-germanium epitaxial growth in some areas and discouraging such epitaxial growth in other areas of the semiconductor device.

These and other aspects of the disclosure will be apparent upon consideration of the following detailed description.

BRIEF DESCRIPTION OF THE DRAWINGS

A more complete understanding of the present disclosure and the potential advantages of various aspects described herein may be acquired by referring to the following description in consideration of the accompanying drawings, in which like reference numbers indicate like features, and wherein:

FIG. 1 is a side cut-away view of an illustrative semiconductor device prior to a fluorine implant;

FIG. 2 is a side cut-away view of the semiconductor device of FIG. 1 during the fluorine implant;

FIG. 3 is a side cut-away view of the semiconductor device of FIG. 2 showing epitaxial growth of a boron-doped silicon-germanium layer;

FIG. 4 is a side cut-away view of the semiconductor device of FIG. 3 showing a silicide layer formed on the boron-doped silicon-germanium layer.

Figure 5:
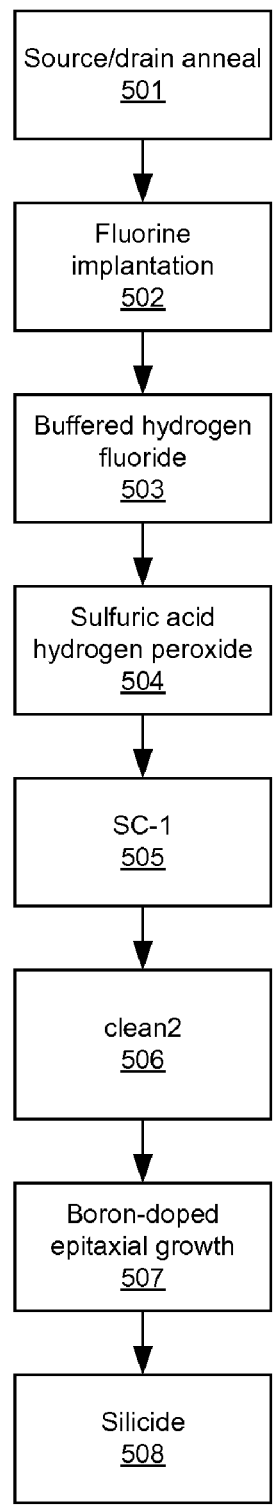
FIG. 5 is a flowchart showing illustrative steps for manufacturing the semiconductor device of FIGS. 1-4.

The various figures are not necessarily drawn to scale.

DETAILED DESCRIPTION

Referring to FIG. 1, an illustrative embodiment of a semiconductor device includes a silicon layer 101 substrate that may be divided into at least two regions: a p-type well (p-well) 107 and an n-type well (n-well) 108. At least two field-effect transistors (FETs) may also included: an n-type field-effect transistor (NFET) 150 disposed on and in p-well 107, and a p-type field-effect transistor (PFET) 160 disposed on and in n-well 108. Each of NFET 150 and PFET 160 has a gate formed from a conductive layer 102. Conductive layer 102 may be made of any one or more conductive materials, such as but not limited to polysilicon. In addition, insulating layers 104, 105, and 106 are disposed on at least opposing sides of each gate, and insulating layer 106 is additionally disposed on and over each gate. It will be understood that the two regions and two FETs of FIG. 1 are merely illustrative, and that the pattern shown may be repeated many times within the same semiconductor device and upon the same substrate.

Insulating layer 105 may be made from any one or more insulating materials, for example an oxide, such as but not limited to silicon oxide. Insulating layer 106 acts as a gate sidewall spacer layer and may be made from any one or more insulating materials, such as but not limited to silicon nitride. The structure shown in FIG. 1 is a known structure that may be used as a prelude to forming a complementary pair of FETs (i.e., an NFET and PFET pair) as part of a novel semiconductor device, as will be described in connection with various illustrative embodiments and with reference to additional figures.

Silicon layer 101 may be any type, or a portion of any type, of substrate configuration, such as but not limited to a single bulk silicon layer (e.g., a pure silicon wafer), or an upper layer of a silicon-on-insulator (SOI) wafer structure. Where silicon layer 101 is part of an SOI structure, silicon layer 101 may be very thin. For example, silicon layer 101 may have a thickness of less then 30 nm, or even less than 20 nm. Where silicon layer 101 is very thin, a substrate-embedded boron-doped silicon-germanium layer that is found in some conventional devices may not necessarily be feasible. As will be discussed below, a boron-doped silicon-germanium layer may instead, for example, be disposed upon the top surface of silicon layer 101, such as over the source/drain regions of PFET 160.

FIG. 5 shows an outline of an illustrative embodiment of a manufacturing process that may be performed on the structure of FIG. 1, as will be discussed below. It will be understood that the steps shown in FIG. 5 are not limiting, and that additional steps may be performed prior to, during, and/or after the steps shown in FIG. 5.

Accordingly, referring to the example of FIGS. 2 and 5, the source/drain regions of NFET 150 and PFET 160 are formed by ion implantation and annealing (step 501). Next, fluorine ions are simultaneously implanted into both the region of NFET 150 and the region of PFET 160 without necessarily using a mask (step 502). While various ion implantation magnitudes may be used, in some embodiments a fluorine ion implantation of about 1 keV 3e14 cm-2, or more, may be used. It has been found that such fluorine ion implantation may help to suppress boron-doped silicon-germanium epitaxial growth at the source/drain regions NFET 150 (where such growth is undesirable in this particular example), while still potentially allowing desirable boron-doped silicon-germanium epitaxial growth to occur at the source/drain regions of PFET 160.

As will be seen in connection with FIG. 3, such selective epitaxial growth suppression may, for instance, allow the boron-doped silicon-germanium epitaxial growth at PFET 160 source/drain regions to be self-aligning without the necessarily requiring the use of a mask during this step.

Next, referring to the examples of FIGS. 3 and 5, some or all of the exposed portions of insulating oxide layer 105 are removed from the source/drain regions of NFET 150 and PFET 160. This removal may be achieved, for example, by performing a wet etching process. In one example, buffered hydrogen fluoride may be used to remove exposed portions of oxide layer 105 (step 503). After removal of oxide layer 105, a solution of sulfuric acid hydrogen peroxide (for example) may be applied in a wet process (step 504). Then, a solution of ammonium hydroxide, peroxide, and water (for example) may be applied as an additional separate wet cleaning process for the exposed surfaces (step 505). This particular wet cleaning process is commonly referred to as Standard Clean 1 (SC-1) or RCA-1 Clean.

While the SC-1 step is normally used to clean bare silicon or an oxide layer, it has not been normally used at this point in a manufacturing process. However, through experimentation, it has been found that by performing the SC-1 step in the present context of a manufacturing process, this may encourage epitaxial growth of boron-doped silicon-germanium over p-doped silicon, such as over the source/drain regions in n-well 108 at PFET 160, but not over n-doped silicon, such as over the source/drain regions in p-well 107 at NFET 150.

Therefore, with the combination of fluoride ion implantation that suppresses boron-doped silicon-germanium epitaxial growth over the source/drain regions of NFET 150 and the SC-1 process that encourages such epitaxial growth over the source/drain regions of PFET 160, selective epitaxial growth therefore may be achieved without the need for a mask.

Next, in step 506, any remaining portions of oxide layer 105 and/or incidentally formed oxide that are undesirable are further cleaned and removed. This step may involve, for example, applying a mixture of gaseous hydrofluoric (HF) acid and vaporous ammonia to the semiconductor device in order to remove exposed portions of oxide layer 105.

After the step 506 is completed (referred to herein as "clean2"), a boron-doped silicon-germanium (SiGe) layer 301 (as illustratively shown in FIG. 3) is epitaxially grown on the exposed silicon wafer surface in step 507. Because of suppression action by the fluorine implantation step 502 and/or the encouragement action by the SC-1 and/or clean2 cleaning steps 505, 506 previously performed, the silicon-germanium may grow substantially or exclusively only over the source/drain regions of PFET 160, and not over the source/drain regions of NFET 150. The resulting boron-doped silicon-germanium layer 301 may be relatively thin, such as but not limited to a thickness of about 300 angstroms thick or less. However, boron-doped silicon-germanium layer 301 may be of a greater or lesser thickness, as desired.

Referring to the examples of FIGS. 4 and 5, the semiconductor device may be further manufactured by forming separate silicide contacts 401 (step 508) over various portions of silicon-germanium layer 301, the source/drain regions of NFET 150, and the gates of NFET 150 and PFET 160. For example, for each of NFET 150 and PFET 160, silicide contacts 401 may be added on opposing lateral sides of conductive layer 102, as shown in FIG. 4.

Table 1 below shows various example combinations of ion implantation and cleaning steps that have been experimentally performed in order to find a combination that encourages an appropriate amount of boron-doped silicon-germanium epitaxial growth over PFET 160 while suppressing completely, or substantially suppressing, such epitaxial growth over NFET 150.

TABLE 1

| Implant | SC-1 | clean2 | NFET Epi Growth | PFET Epi Growth |
|---------|------|--------|-----------------|-----------------|
| —       | —    | yes    | no growth       | no growth       |
| —       | yes  | yes    | spotty growth   | growth          |
| Ge      | yes  | yes    | spotty growth   | spotty growth   |
| F       | yes  | yes    | no growth       | growth          |

As can be seen, Table 1 shows four illustrative combinations of ion implantation and cleaning steps. In a first combination tested (shown on the first line of Table 1), only the clean2 step (step 506) was performed. This resulted in little or no boron-doped silicon-germanium epitaxial growth on both the NFET source/drain regions and the PFET source/drain regions.

In a second combination tested as shown in Table 1 (shown on the second line of Table 1), both the SC-1 and clean2 steps (i.e., steps 505 and 506) were performed, but without performing the ion implantation step (i.e., step 502). While this resulted in significant boron-doped silicon-germanium epitaxial growth over the PFET source/drain regions, it also resulted in undesirable spotty epitaxial growth over the NFET source/drain regions.

In a third combination tested as shown in Table 1 (shown on the third line of Table 1), step 502 was replaced with a germanium ion implantation step, and also both the SC-1 and clean2 steps (i.e., steps 505 and 506) were performed. In that case, undesirable spotty boron-doped silicon-germanium epitaxial growth occurred over the NFET source/drain regions, and in addition insufficient spotty epitaxial growth occurred over the PFET source/drain regions.

In a fourth combination tested as shown in Table 1 (shown on the fourth line of Table 1), the steps as shown in FIG. 5 were performed. In particular, the fluorine ion implantation of step 502 was performed, as well as both the SC-1 and clean2 steps 505 and 506. In that fourth test, little or no boron-doped silicon-germanium epitaxial growth was observed to have occurred over the NFET source/drain regions, and significant epitaxial growth was observed to have occurred over the PFET source/drain regions. This fourth combination test was therefore considered the most desirable of the four tested combinations.

Thus, various illustrative techniques have been described for reducing the resistance of the silicide contacts of a PFET, by increasing the boron dopant concentration of those regions of the silicon that interface with the silicide contacts. While the foregoing descriptions and the associated drawings may relate to a semiconductor fabrication process, many modifications and other embodiments will come to mind to one skilled in the art having the benefit of the teachings presented. For example, references to particular chemical treatments, manufacturing steps, and particular implantation magnitudes are illustrative only, and other chemical treatments, manufacturing steps, and implantation magnitudes may be applied.

What is claimed is:

1. A method for manufacturing a semiconductor device, comprising:
   forming a first conductive layer over a p-well of a silicon layer;
   forming a second conductive layer over an n-well of the silicon layer;
   implanting, after forming the second conductive layer, fluorine ions into both the p-well and the n-well;
   exposing, after implanting the fluorine ions, both the p-well and the n-well to ammonium hydroxide and peroxide;
   applying, after exposing the p-well and the n-well, a mixture of gaseous hydrofluoric (HF) acid and vaporous ammonia to the semiconductor device; and
   selectively epitaxially growing, after applying the mixture, a boron-doped silicon-germanium layer on the n-well of the silicon layer and not on the p-well of the silicon layer, wherein the epitaxial growing is performed without a mask.

2. The method of claim 1, further comprising forming a silicide layer on the boron-doped silicon-germanium layer.

3. The method of claim 1, further comprising forming an insulating layer over both the n-well and the p-well and subsequently removing the insulating layer from both the n-well and the p-well.

4. The method of claim 1, further comprising exposing both the p-well and the n-well to hydrofluoric acid and ammonia.

5. The method of claim 1, wherein forming the first conductive layer comprises forming a first patterned gate electrode over the p-well, and forming the second conductive layer comprises forming a second patterned gate electrode over the n-well.

6. The method of claim 1, further comprising forming source/drain regions in the p-well and in the n-well before implanting fluorine ions into the p-well and the n-well, and wherein:
   implanting the fluorine ions comprises implanting fluorine ions into the source/drain regions in the p-well and the n-well,
   exposing both the p-well and the n-well comprises exposing the source/drain regions in the p-well and the n-well to ammonium hydroxide and peroxide,
   applying the mixture comprises applying a mixture of gaseous hydrofluoric acid and vaporous ammonia to the source/drain regions in the p-well and the n-well, and
   selectively epitaxially growing comprises selectively epitaxially growing the boron-doped silicon-germanium layer on the source/drain regions in the n-well and not in the p-well.

7. The method of claim 6, wherein forming the first conductive layer comprises forming a first patterned gate electrode over the p-well, and forming the second conductive layer comprises forming a second patterned gate electrode over the n-well.

8. A method for manufacturing a semiconductor device, comprising:
   forming a first conductive layer over a p-well of a silicon layer;
   forming a second conductive layer over an n-well of the silicon layer;
   implanting fluorine ions into both the p-well and the n-well while the second conductive layer is disposed over the n-well;
   exposing to ammonium hydroxide and peroxide both the p-well and the n-well having the implanted fluorine ions;
   applying, after exposing the p-well and the n-well, a mixture of gaseous hydrofluoric (HF) acid and vaporous ammonia to the semiconductor device; and
   selectively epitaxially growing, after applying the mixture, a boron-doped silicon-germanium layer on the n-well of the silicon layer and not on the p-well of the silicon layer, wherein the epitaxial growing is performed without a mask.

9. The method of claim 8, wherein forming the first conductive layer comprises forming a first patterned gate electrode over the p-well, and forming the second conductive layer comprises forming a second patterned gate electrode over the n-well.

10. The method of claim 8, further comprising forming source/drain regions in the p-well and in the n-well before implanting fluorine ions into the p-well and the n-well, and wherein:
   implanting the fluorine ions comprises implanting fluorine ions into the source/drain regions in the p-well and the n-well,
   exposing both the p-well and the n-well comprises exposing the source/drain regions in the p-well and the n-well to ammonium hydroxide and peroxide,
   applying the mixture comprises applying a mixture of gaseous hydrofluoric acid and vaporous ammonia to the source/drain regions in the p-well and the n-well, and
   selectively epitaxially growing comprises selectively epitaxially growing the boron-doped silicon-germanium layer on the source/drain regions in the n-well and not in the p-well.

11. The method of claim 10, wherein forming the first conductive layer comprises forming a first patterned gate electrode over the p-well, and forming the second conductive layer comprises forming a second patterned gate electrode over the n-well.

12. The method of claim 1, wherein selectively epitaxially growing comprises selectively expitaxially growing the boron-doped silicon-germanium layer only on the n-well of the silicon layer.

13. The method of claim 8, wherein selectively epitaxially growing comprises selectively epitaxially growing the boron-doped silicon-germanium layer only on the n-well of the silicon layer.

14. The method of claim 1, wherein selectively epitaxially growing comprises selectively epitaxially growing while both the n-well and the p-well are exposed.

15. The method of claim 8, wherein selectively epitaxially growing comprises selectively epitaxially growing while both the n-well and the p-well are exposed.

16. A method for manufacturing a semiconductor device, comprising:
   forming a first conductive layer over a p-well of a silicon layer;
   forming a second conductive layer over an n-well of the silicon layer;
   implanting fluorine ions into both the p-well and the n-well while the second conductive layer is disposed over the n-well;
   exposing to ammonium hydroxide and peroxide both the p-well and the n-well having the implanted fluorine ions;
   applying, after exposing the p-well and the n-well, a mixture of gaseous hydrofluoric (HF) acid and vaporous ammonia to the semiconductor device; and
   epitaxially growing, after applying the mixture and while both the n-well and the p-well are exposed, a boron-doped silicon-germanium layer on the n-well of the silicon layer and not on the p-well of the silicon layer.

* * * * *

UNITED STATES PATENT AND TRADEMARK OFFICE
CERTIFICATE OF CORRECTION

PATENT NO.         : 8,153,501 B2
APPLICATION NO.    : 12/397279
DATED              : April 10, 2012
INVENTOR(S)        : Gaku Sudo It is certified that error appears in the above-identified patent and that said Letters Patent is hereby corrected as shown below:

In the Assignee section (73):
        Please replace "Toshiba America Electronic Components, Inc., Irvine, CA (US)" with --Kabushiki Kaisha Toshiba, Tokyo (JP)--

Signed and Sealed this
Twenty-fifth Day of September, 2012

David J. Kappos
*Director of the United States Patent and Trademark Office*